United States Patent
Ide et al.

(10) Patent No.: US 9,960,423 B2
(45) Date of Patent: May 1, 2018

(54) SPINEL-TYPE LITHIUM METAL COMPOSITE OXIDE

(71) Applicant: Mitsui Mining & Smelting Co., Ltd., Tokyo (JP)

(72) Inventors: Hitohiko Ide, Takehara (JP); Daisuke Washida, Takehara (JP); Yuji Hoshi, Takehara (JP); Yoshimi Hata, Takehara (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 51 days.

(21) Appl. No.: 15/037,850

(22) PCT Filed: Nov. 21, 2014

(86) PCT No.: PCT/JP2014/080927
§ 371 (c)(1),
(2) Date: May 19, 2016

(87) PCT Pub. No.: WO2015/076376
PCT Pub. Date: May 28, 2015

(65) Prior Publication Data
US 2016/0276665 A1    Sep. 22, 2016

(30) Foreign Application Priority Data

Nov. 22, 2013 (JP) .................. 2013-241586

(51) Int. Cl.
*H01B 1/08* (2006.01)
*H01M 4/00* (2006.01)
(Continued)

(52) U.S. Cl.
CPC ........ *H01M 4/505* (2013.01); *C01G 45/1242* (2013.01); *C01G 51/54* (2013.01);
(Continued)

(58) Field of Classification Search
CPC . H01B 1/00; H01B 1/08; C01G 45/00; C01G 45/02; C01G 45/1221; H01M 4/485; H01M 4/50; H01M 4/505
See application file for complete search history.

(56) References Cited

U.S. PATENT DOCUMENTS 6,190,800 B1 *  2/2001  Iltchev ................. C01G 45/02
                                                       423/599
6,516,374 B1    2/2003  Kinoshita et al.
(Continued)

FOREIGN PATENT DOCUMENTS

CN    102916175 A    2/2013
JP    2000-228195 A  8/2000
(Continued)

OTHER PUBLICATIONS

Hao et al "Improved electrode kinetics in lithium manganospinel nanoparticles . . . ", J. Mater. Chem. 2012, 22, 1578 (Year: 2012).*
(Continued)

*Primary Examiner* — Mark Kopec
(74) *Attorney, Agent, or Firm* — The Webb Law Firm

(57) ABSTRACT

Provided is a spinel-type lithium metal composite oxide that makes it possible to achieve excellent high-temperature storage characteristics when used as a positive electrode active material of a lithium battery. The spinel-type (Fd-3m) lithium metal composite oxide is characterized by the oxygen occupancy (OCC) thereof as determined by the Rietveld method being 0.965-1.000, the lattice strain thereof as determined by the Williamson-Hall method being 0.015-0.090, and the ratio (Na/Mn) of the molar content of Na to the molar content of Mn satisfying $0.00 < Na/Mn < 1.00 \times 10^{-2}$.

15 Claims, 1 Drawing Sheet

(51) Int. Cl.

| | | |
|---|---|---|
| *H01M 4/505* | (2010.01) | |
| *H01M 4/525* | (2010.01) | |
| *C01G 45/12* | (2006.01) | |
| *C01G 51/00* | (2006.01) | |
| *C01G 53/00* | (2006.01) | |
| *C30B 29/22* | (2006.01) | |
| *H01M 2/16* | (2006.01) | |
| *H01M 4/38* | (2006.01) | |
| *H01M 4/62* | (2006.01) | |
| *H01M 4/66* | (2006.01) | |
| *H01M 10/0525* | (2010.01) | |
| *H01M 10/0568* | (2010.01) | |
| *H01M 10/0569* | (2010.01) | |
| *H01M 10/0585* | (2010.01) | |
| *H01M 4/04* | (2006.01) | |
| *H01M 4/131* | (2010.01) | |
| *H01M 4/1391* | (2010.01) | |
| *H01M 4/02* | (2006.01) | |
| *H01M 10/052* | (2010.01) | |

(52) U.S. Cl.
CPC .............. *C01G 53/54* (2013.01); *C30B 29/22* (2013.01); *H01B 1/08* (2013.01); *H01M 2/162* (2013.01); *H01M 2/1653* (2013.01); *H01M 4/382* (2013.01); *H01M 4/525* (2013.01); *H01M 4/623* (2013.01); *H01M 4/625* (2013.01); *H01M 4/661* (2013.01); *H01M 10/0525* (2013.01); *H01M 10/0568* (2013.01); *H01M 10/0569* (2013.01); *H01M 10/0585* (2013.01); *C01P 2002/32* (2013.01); *C01P 2002/60* (2013.01); *C01P 2002/76* (2013.01); *C01P 2006/40* (2013.01); *H01M 4/0404* (2013.01); *H01M 4/0471* (2013.01); *H01M 4/131* (2013.01); *H01M 4/1391* (2013.01); *H01M 10/052* (2013.01); *H01M 2004/021* (2013.01); *H01M 2004/027* (2013.01); *H01M 2004/028* (2013.01); *H01M 2220/20* (2013.01); *H01M 2300/0037* (2013.01)

(56) References Cited

U.S. PATENT DOCUMENTS

| | | |
|---|---|---|
| 2002/0122767 A1 | 9/2002 | Takahashi |
| 2012/0052375 A1* | 3/2012 | Johnson ................ C01G 53/44 429/206 |
| 2013/0187083 A1 | 7/2013 | Iwata et al. |
| 2016/0301072 A1* | 10/2016 | Yamaguchi ........... H01M 4/505 |

FOREIGN PATENT DOCUMENTS

| | | |
|---|---|---|
| JP | 2000-305677 A | 11/2000 |
| JP | 2000-306577 A | 11/2000 |
| JP | 2000-323140 A | 11/2000 |
| JP | 2000-331682 A | 11/2000 |
| JP | 2002-308627 A | 10/2002 |
| JP | 2002-308628 A | 10/2002 |
| JP | 2003-217589 A | 7/2003 |
| JP | 2004-087278 A | 3/2004 |
| JP | 2012-188341 A | 10/2012 |
| WO | 2009/054436 A1 | 4/2009 |
| WO | 2010/114015 A1 | 10/2010 |
| WO | 2013/161949 A1 | 10/2013 |

OTHER PUBLICATIONS

Fell et al "Correlation between oxygen vacancy, microstrain, and cation distribution in lithium-excess layered oxides . . . ", Chem. Mater. 2013, 25, 1623-9. (Year: 2013).*

* cited by examiner

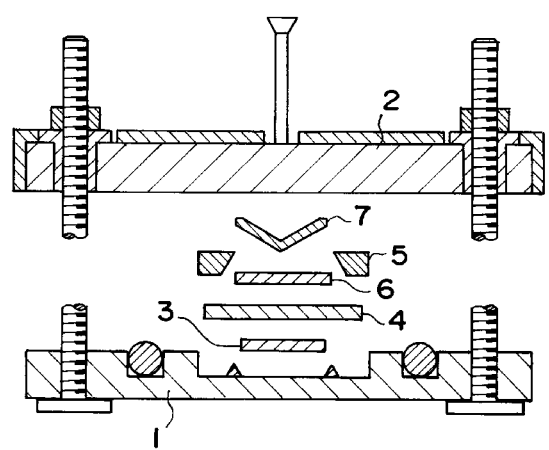

SPINEL-TYPE LITHIUM METAL COMPOSITE OXIDE

CROSS-REFERENCE TO RELATED APPLICATIONS

This application is the United States national phase of International Application No. PCT/JP2014/080927 filed Nov. 21, 2014, and claims priority to Japanese Patent Application No. 2013-241586 filed Nov. 22, 2013, the disclosures of which are hereby incorporated in their entirety by reference.

TECHNICAL FIELD

The present invention relates to a spinel-type lithium metal composite oxide which can be used as a positive electrode active material for lithium batteries, and particularly, to a spinel-type lithium metal composite oxide having a spinel structure (Fd-3m) which can be suitably used as a positive electrode active material for batteries mounted in electric vehicles (EVs), hybrid electric vehicles (HEVs), and the like.

BACKGROUND ART

Lithium batteries, particularly, lithium secondary batteries, have characteristics such as high energy density and long lifespan, and therefore, the lithium batteries are widely used as power supplies for electric appliances such as video cameras, portable electronic devices such as notebook computers and mobile telephones, electric tools such as power tools, and the like. Recently, the lithium batteries have been also applied to large-sized batteries that are mounted in electric vehicles (EVs), hybrid electric vehicles (HEVs), and the like.

The lithium secondary battery is a secondary battery having a structure in which, at the time of charging, lithium is eluted from the positive electrode as ions and moves to a negative electrode to be stored therein, and at the time of discharging, lithium ions return from the negative electrode to the positive electrode. It is known that a high energy density of the lithium secondary battery is caused by a potential of a positive electrode material.

As a positive electrode active material for these types of the lithium secondary batteries, there are known lithium metal composite oxides such as $LiCoO_2$, $LiNiO_2$, and $LiMnO_2$ which have a layered structure and lithium metal composite oxides (in the invention, also referred to as "LMO") such as $LiMn_2O_4$ and $LiNi_{0.5}Mn_{1.5}O_4$ which have a manganese-based spinel structure (Fd-3m).

Among them, the manganese-based spinel-type lithium metal composite oxide (LMO) are produced from inexpensive materials, are non-toxic and safe, and have properties highly tolerant to overcharging, and therefore, attention has been paid as a next-generation positive electrode active material for large-sized batteries used for electric vehicles (EVs), hybrid electric vehicles (HEVs), and the like. In addition, since a spinel-type lithium metal composite oxide (LMO) that is capable of three-dimensional insertion and release of Li ions, has superior power output characteristics compared with the lithium metal composite oxide having the layered structure, such as $LiCoO_2$, the spinel-type lithium metal composite oxide is expected to be useful in applications where excellent power output characteristics are required, such as batteries for EV and batteries for HEV.

With respect to the spinel-type lithium metal composite oxide (LMO), conventionally, for example, JP 2000-306577 A discloses a positive electrode active material for a non-aqueous electrolytic liquid secondary battery that is a lithium manganese oxide having a spinel-type crystal structure represented by a formula $Li_{1+x}MnMg_{1y}Al_{2z}O_4$ (where, $x≥0$, y, and $z>0$), the positive electrode active material having excellent high-temperature cycle characteristics or high-temperature storage characteristics in the nonaqueous electrolytic liquid secondary battery.

JP2000-323140 A discloses a positive electrode material for a nonaqueous electrolytic liquid secondary battery characterized by being obtained in such a manner that a part of Mn in a spinel structure represented by a composition formula $LiMn_2O_4$ is substituted with at least one selected from Li, Na, K, Co, or Al and at least one selected from Mg, Ti, Cr, Fe, or Cu, and obtained in such a manner that a part of O (oxygen) is substituted with F (fluorine), wherein a lattice constant "a" is equal to or less than 8.22 Å, a specific surface area is 0.8 m²/g or less, and a mean valence of Mn is 3.7 or less.

JP2000-331682 A discloses a positive electrode material for a lithium secondary battery which is a Li—Mn composite oxide having a spinel structure obtained in such a manner that a part of cations in the spinel structure represented by a composition formula $LiMn_2O_4$ is substituted with at least one selected from Na, K, Co, Al, Mg, Ti, Cr, Fe, Cu, or Ni, and one or both of occupancy (gc) of the cations in a unit lattice determined from a composition, a lattice constant, and a density and occupancy (ga) of anions in a unit lattice determined from a composition, a lattice constant, and a density are characterized by being 0.985 or less.

WO 2009/054436 A (WO 2009/054436 A1) discloses a spinel-type lithium metal composite oxide (LMO) in which both power output characteristics and charge-discharge cycle ability during a high-temperature cycle can be balanced, wherein an inter-atomic distance Li—O is defined to be 1.971 Å to 2.006 Å as measured by the Rietveld method using a fundamental method in a lithium metal composite oxide represented by a general formula $Li_{1+x}M_{2-x}O_4$ (where M is a transition metal including Mn, Al and Mg and x is 0.01 to 0.08).

WO 2010/114015 A (WO 2010/114015 A1) discloses a positive electrode active material for lithium battery that can increase a filling density, can increase power output characteristics, and has a low voltage drop during storage in a state of being charged at a high temperature, the positive electrode active material for lithium battery including a spinel-type (Fd-3m) lithium metal composite oxide represented by a general formula $Li_{1+x}M_{2-x}O_{4-\delta}$ (where M represents a transition metal including Mn, Al and Mg, x represents 0.01 to 0.08, and $0≤\delta$) and a boron compound, wherein an inter the atomic distance Li—O of the spinel-type lithium metal composite oxide is 1.971 Å to 2.006 Å, and the amount of magnetic substance measured for the positive electrode active material for lithium battery is 600 ppb or less.

Upon considering a use for a battery mounted in electric vehicles (EVs), hybrid electric vehicles (HEVs), or the like, a spinel-type lithium metal composite oxide needs to have characteristics (referred to as "high-temperature storage characteristics") capable of maintaining capacity even in a state of being stored at a high temperature, when being used as a positive electrode active material for a lithium battery.

Therefore, the invention is intended to provide a novel spinel-type lithium metal composite oxide having excellent high-temperature storage characteristics capable of maintaining capacity even in a state of being stored at a high temperature, when being used as a positive electrode active material for a lithium battery.

SUMMARY OF THE INVENTION

The invention proposes a spinel-type (Fd-3m) lithium metal composite oxide characterized in that oxygen occupancy (OCC) is 0.965 to 1.000 as determined by the Rietveld method, lattice strain is 0.015 to 0.090 and preferably 0.020 to 0.090 as determined by the Williamson-Hall method, and a ratio (Na/Mn) of a molar content of Na to a molar content of Mn satisfies $0.00 < Na/Mn < 1.00 \times 10^{-2}$.

Effect of the Invention

In conventional product development of a spinel-type (Fd-3m) lithium metal composite oxide to be used as a positive electrode active material for a lithium battery, a spinel-type lithium metal composite oxide having high oxygen occupancy (OCC) and small strain has been generally required.

A spinel-type lithium metal composite oxide proposed by the invention is characterized in that the oxygen occupancy (OCC) is high, the content of Na is relatively high, and Na is taken in a 16d site of an Fd-3m crystal structure, whereby lattice strain is relatively large. Therefore, the spinel-type lithium metal composite oxide proposed by the invention can have excellent high-temperature storage characteristics when being used as a positive electrode active material for a lithium battery and can maintain capacity even when being stored at a high temperature. This can be inferred from the fact that since lattice strain of a crystal structure becomes moderately large when Na is taken in the 16d site, and thus variation in strain (variation in stress) associated with expansion and contraction of the crystal structure caused by insertion and release of lithium ions during charging and discharging is mitigated and instability of the crystal structure is mitigated in a state where lithium is insufficient as in the case of being stored at a high temperature during the charging and discharging, the high-temperature storage characteristics is increased.

Accordingly, the spinel-type lithium metal composite oxide proposed by the invention can be used as a positive electrode active material for a lithium battery and is particularly preferably used as a positive electrode active material for a battery mounted in electric vehicles (EVs), hybrid electric vehicles (HEVs), and the like.

BRIEF DESCRIPTION OF DRAWING

The drawing depicts a structure of a cell for electrochemical evaluation used in battery characteristic evaluation according to Examples.

DETAILED DESCRIPTION AND MODE(S) FOR CARRYING OUT THE INVENTION

Next, the invention will be described by way of embodiments. However, the invention is not intended to be limited to the embodiments that will be described below.

<LMO of the Invention>

A spinel-type (Fd-3m) lithium metal composite oxide (hereinafter, also referred to as an "LMO of the invention") according to one embodiment of the invention is characterized in that oxygen occupancy (OCC) is 0.965 to 1.000 as determined by the Rietveld method, lattice strain is 0.015 to 0.090 and is preferably 0.020 to 0.090 as determined by the Williamson-Hall method, and a ratio (Na/Mn) of a molar content of Na to a molar content of Mn satisfies $0.00 < Na/Mn < 1.00 \times 10^{-2}$.

(Oxygen Occupancy)

The oxygen occupancy (OCC) of the LMO of the invention is important to be 0.965 to 1.000 as determined by the Rietveld method.

By control of the oxygen occupancy to be 0.965 to 1.000, an influence of the oxygen occupancy on an electron density can be adjusted to a preferred range. Thus, it is considered that a crystal structure can be further stabilized.

From such a viewpoint, the oxygen occupancy of the LMO of the invention is important to be 0.965 to 1.000, more preferably from 0.965 to 0.995, and further more preferably from 0.965 to 0.990.

The oxygen occupancy of the LMO of the invention can be controlled by adjustment of kinds and an addition amount of calcination accelerant, calcination conditions (temperature and/or atmosphere), annealing conditions (temperature and/or atmosphere, time, and temperature lowering conditions). For example, when calcination is performed under a low oxygen concentration atmosphere, oxygen deficiency easily occurs compared to the case of calcination under an oxygen atmosphere (oxygen of approximately 100%). However, the invention is not limited to such a method.

(Lattice Strain)

The LMO of the invention is important to have the lattice strain of 0.015 to 0.090 as determined by the Williamson-Hall method.

The lattice strain becomes relatively large by insertion of Na into the 16d site to appropriately increase a lattice strain before storage (initial stage), whereby changes in the lattice strain after storage can be suppressed. As a result, the spinel-type lithium metal composite oxide can be improved in high-temperature storage characteristics when being used as a positive electrode active material for a lithium battery. On the other hand, when the lattice strain is too large, output characteristics (rate characteristics), charge-discharge cycle ability during a high temperature cycle, or the like becomes inferior.

From such a viewpoint, the lattice strain of the LMO of the invention as determined by the Williamson-Hall method is important to be 0.015 to 0.090, more preferably from 0.017 to 0.060, and particularly preferably from 0.020 to 0.040.

In order to adjust the lattice strain of the LMO of the invention, Na-containing manganese dioxide may be used as a manganese material such that Na is easily taken in the 16d site and kinds and an amount of the calcination accelerant, calcination conditions, annealing conditions, and the like may be adjusted at the same time such that Na is easily taken in the 16d site. With respect to the Na-containing manganese dioxide, it is particularly preferred to use Na-containing manganese dioxide containing a large amount of bound water in particular. However, the invention is not limited to such a method.

(Crystallite Size)

The crystallite size of the LMO of the invention, that is, the crystallite size determined by the measuring method by the Rietveld method (specifically, described in Examples) is preferably 100 nm to 250 nm, more preferably from 150 nm to 250 nm, and further more preferably from 160 nm to 220 nm.

When the crystallite size of the LMO of the invention is relatively small, it is possible to tend to enhance output.

The crystallite size of the LMO of the invention can be adjusted by, for example, compositions, grain sizes of a material, or calcination conditions. For example, the crystallite size can be reduced by lowering of calcination temperature. However, the invention is not limited to such a method.

Here, the "crystallite" means the maximum group regarded as a single crystal, which can be determined by XRD measurement and Rietveld analysis.

Particles of the smallest units which are constituted by a plurality of crystallites and which are surrounded by grain boundaries when being observed by an SEM (for example, at a magnification of 3000 times) are referred to as "primary particles" in the invention. Accordingly, the primary particles include a single crystal and a polycrystal.

In addition, the plurality of primary particles, which are aggregated to share a part of respective circumferences (grain boundaries) and isolated from other particles, are referred to as a "secondary particle" or an "aggregated particle", in the invention.

(Na/Mn)

The LMO of the invention is important to have the ratio (Na/Mn) of the molar content of Na to the molar content of Mn satisfying $0.00 < Na/Mn < 1.00 \times 10^{-2}$.

When the Na/Mn of the LMO of the invention satisfies $0.00 < Na/Mn < 1.00 \times 10^{-2}$, Na can be easily taken in the 16d site, and strain can be introduced into the crystal lattice of LMO of the invention at a predetermined ratio.

From such a viewpoint, the molar ratio (Na/Mn) of the LMO of the invention is important to satisfy $0.00 < Na/Mn < 1.00 \times 10^{-2}$, preferably from $0.80 \times 10^{-4}$ to $0.50 \times 10^{-2}$, and more preferably from $0.80 \times 10^{-4}$ to $0.25 \times 10^{-2}$.

Whether or not Na is taken in the 16d site can be confirmed by performing XRD measurement and by determining whether the result of the Rietveld analysis that the Na fraction is assigned to the 16d site is appropriate.

In order to adjust the Na/Mn in the LMO of the invention, the Na-containing manganese dioxide may be used as a manganese material such that Na is easily taken in the 16d site and washing conditions or the like is adjusted. However, the invention is not limited to such a method.

(Composition)

In regard to the LMO of the invention, the composition is not particularly limited as long as the LMo has a crystal structure of spinel-type (Fd-3m).

However, when the comprehensive characteristics in the case of being used as a positive electrode active material for lithium batteries are considered, a spinel-type lithium metal composite oxide represented by General Formula (1): $Li_{1+x}M_{2-x}O_4$ (wherein, M in the formula represents metal elements including one or two or more elements selected from the group consisting of Mn, Al, Mg, Ca, Ti, Ba, Cr, Fe, Co, Ni, Cu, and Zn) is preferred.

In General Formula (1), "x" is preferably 0.01 to 0.09. This is because when the LMO contains a large amount of Li, even when the LMO is washed, it is difficult for Li to come out, and resistance to solvent such as water is increased. Therefore, from such a viewpoint, "x" is preferably 0.01 to 0.09, more preferably from 0.02 to 0.08, still more preferably from 0.02 to 0.07, and particularly preferably from 0.02 to 0.05.

Since the LMO of the invention includes oxygen deficiency, an atomic ratio "4" of oxygen in the above-described General Formula (1) means to allow some non-stoichiometry (for example, $4-\delta$ ($0 \leq \delta$)) to be included, or a portion of oxygen may be substituted by fluorine.

(Impurities)

In addition, the LMO of the invention may contain constituents other than the above, the each of the constituents being contained to the extent of 0.5 wt % or less. The reason is that the amount of this extent is considered to hardly affect the performance of the LMO of the invention.

<Production Method>

Next, an example of a method of producing the LMO of the invention will be described.

The LMO of the invention can be obtained by using a predetermined material, particularly, a predetermined manganese material in which Na is easily taken in the 16d site, adding a calcination accelerant into the material such that Na is easily taken in the 16d site, and performing steps of calcining, annealing, crushing, and washing of the material under predetermined conditions. However, the invention is not intended to be limited to such a production method.

The detailed description will be given below.

(Material)

As a starting material, for example, the M element material such as a lithium material, a manganese material, or a magnesium material in the $Li_{1+x}M_{2-x}O_4$ and a boron material may be appropriately selected.

The lithium material is not particularly limited, and examples thereof may include lithium salts, for example, lithium hydroxide (LiOH), lithium carbonate ($Li_2CO_3$), lithium nitrate ($LiNO_3$), lithium hydroxide monohydrate ($LiOH.H_2O$), lithium oxide ($Li_2O$), other fatty acid lithium and lithium halides. Among them, the lithium hydroxide salt, the lithium carbonate salt, and the lithium nitrate salt are preferred.

As the manganese material, it is preferred that the ratio (Na/Mn) of the molar content of Na to the molar content of Mn is 0.0001 or more, and it is particularly preferred that the ratio is 0.0002 or more. Manganese dioxide or trimanganese tertaoxide satisfying $0.002 < Na/Mn < 0.026$ is further preferably used as a material.

As the manganese material, for example, natural manganese dioxide, chemically synthesized manganese dioxide, electrolytic manganese dioxide, and chemically synthesized trimanganese tertaoxide may be included. Among them, the electrolytic manganese dioxide (referred to as an "EMD") or the chemically synthesized trimanganese tertaoxide is preferably used, and Na-containing electrolytic manganese dioxide is further preferably used. The Na-containing manganese dioxide containing a large amount of bound water is still further preferably used. The amount of bound water can be measured by measurement of the weight loss in the range of from 150° C. to 500° C. using differential thermal analysis, for example.

There are no particular limitations on the magnesium material, and for example, magnesium oxide (MgO), magnesium hydroxide ($Mg(OH)_2$), magnesium fluoride ($MgF_2$), and magnesium nitrate ($Mg(NO_3)_2$) can be used. Among them, the magnesium oxide is preferred.

As the M element material, for example, oxides or hydroxides containing the M element can be used. However, the M element material is not limited to these materials. For example, when the M element is aluminum, as an aluminum material, aluminum hydroxide ($Al(OH)_3$) and aluminum fluoride ($AlF_3$) can be used, and among them, the aluminum hydroxide is preferred.

(Calcination Accelerant)

As a calcination accelerant, in addition to boron or boron compounds, substances having a melting point lower than or equal to the calcination temperature, for example, compounds such as a vanadium compound ($V_2O_5$), an antimony compound ($Sb_2O_3$), and a phosphorus compound ($P_2O_5$), can be included.

When the calcination is performed by the addition of such a calcination accelerant, sintering of fine particles in which the crystal particles of the LMO are aggregated can be promoted and a densely agglomerated fine particles (secondary particles) can be formed, and thus a filling density (tap density) can be increased. At the same time, since the generation and growth of crystals of the LMO can be promoted, the crystallite size can be increased.

The boron or the boron compound may be a compound containing boron (B element).

Although it is considered that the boron or the boron compound added prior to the calcination is altered morphologically by the calcination, it is difficult to specify accurately the morphology thereof. However, from the fact that the boron or the boron (B element) in the boron compound exists in a state of being eluted by water, it has been confirmed that the B element is not a spinel constituting element and is present outside the spinel as a boron compound in a certain form. Therefore, boron (B element) is not present in the spinel, and a clear concentration gradient of boron (B element) does not exist on the surface and inside of the crystal particles.

The amount of the calcination accelerant, for example, the boron or the boron compound to be added is preferably adjusted in such manner that the ratio (B/Mn) of a molar content of B to a molar content of Mn is $0.001 < B/Mn < 0.1$ and preferably $0.0025 \leq B/Mn \leq 0.04$.

When the amount of the calcination accelerant is added with such an amount, it is possible to obtain a useful effect as a sintering aid and promote sintering even at a low-temperature environment. Since oxygen atoms in the crystal structure tend to be lost at a region where the calcination temperature is high, the sintering can be performed at the low temperature, thereby reducing the oxygen deficiency.

(Mixing Method)

With respect to the mixing of the materials, the mixing method is not particularly limited as long as the materials can be uniformly mixed. For example, the respective materials may be added simultaneously or in an appropriate order, and may be stirred and mixed in a wet mode or a dry mode, using a known mixing machine such as a mixer.

As dry mixing, for example, a mixing method using a precision mixing machine which rotates mixed powders at a high speed can be exemplified.

On the other hand, as wet mixing, a mixing method of adding a liquid medium such as water or a dispersant, performing wet mixing to obtain slurry, and grinding the obtained slurry using a wet grinding mill, can be exemplified. It is particularly preferable to grind the slurry to a submicron order. After grinding the slurry to the submicron order, the slurry is subjected to granulation and calcination, whereby uniformity of the respective particles prior to the calcination reaction can be increased and reactivity can be increased.

(Granulation)

The materials mixed as described above may be calcined after being granulated to a predetermined size, if necessary. However, granulation may not be essentially carried out.

The granulation method may be a wet method or a dry method, as long as the various materials ground in the previous step are dispersed in the granulated particles without being separated, and examples of the granulation method include an extrusion granulation method, a rolling granulation method, a fluidized granulation method, a mixing granulation method, a spray drying granulation method, a pressure molding granulation method, and a flake granulation method using a roll or the like. However, when the granulation is carried out using the wet method, sufficient drying is necessary prior to calcination.

Regarding the drying method at this time, the drying may be performed by a known drying method such as a thermal spray drying method, a hot air drying method, a vacuum drying method, or a freeze-drying method, and among them, the thermal spray drying method is preferred. The thermal spray drying method is preferably carried out using a thermal spray drying machine (spray dryer). When the granulation is carried out using the thermal spray drying machine (spray dryer), particle size distribution can be sharper, and secondary particles can be prepared to include aggregated particles (secondary particles) that are aggregated in a round shape.

(Calcination Step)

Calcination is preferably performed under a condition where Na is easily taken in the 16d site.

For example, under an air atmosphere, it is preferable to perform heating such that a calcination temperature is maintained at 500° C. or higher, particularly 700° C. to 1050° C., preferably from 710° C. to 920° C., more preferably from 720° C. to 950° C., particularly preferably from 750° C. to 940° C.

This calcination temperature means a temperature of a calcined product measured when a thermocouple is brought into contact with the calcined product inside a calcination furnace.

A calcination time for maintaining the calcination temperature may vary depending on the calcination temperature, but is preferably from 0.5 hours to 90 hours, more preferably from 1 hour to 80 hours, and still more preferably from 5 hours to 30 hours.

There are no particular limitations on the kind of the calcination furnace. The calcination can be carried out using, for example, a rotary kiln, a stationary furnace, or other calcination furnaces.

(Annealing)

As necessary, annealing (heat treatment) may be carried out in the same calcination furnace as in the calcination to lower the temperature up to 500° C., followed by the calcination.

At this time, a temperature lowering rate up to 500° C. also depends on the calcination temperature, but is preferably 10° C./min or less, more preferably 5° C./min or less, further more preferably 3° C./min or less, and still further more preferably 2° C./min or less.

At this time, the temperature means a temperature of the calcined product measured when a thermocouple is brought into contact with the calcined product inside the calcination furnace.

By the annealing under such a condition, it is possible to effectively take the oxygen released at the calcination step in the LMO structure. In addition, the temperature is lowered without stagnation of the temperature at the range of the temperature lowering rate described above, and thus oxygen atoms capable of getting back to equilibrium at each temperature can be sufficiently taken in the structure.

In addition, the annealing may be carried out under an oxygen pressurized atmosphere. The oxygen pressurized atmosphere means an atmosphere in which an oxygen partial pressure is higher than an air pressure. By the annealing under the oxygen pressurized atmosphere, it is possible to further effectively take the oxygen atoms released at the calcination step in the crystal structure.

(Crushing or Grinding)

After the calcination, crushing or grinding of the obtained LMO of the invention is preferably carried out, if necessary.

At this time, the degree of crushing or grinding is preferred such that the primary particles should not be disintegrated.

(Washing Step)

The LMO powders of the invention obtained as described above is filtered by being brought into contact with water, and thus impurities contained the powders, for example, Na compounds formed on the surface of the lithium metal composite oxide are preferably removed.

As a washing method, for example, the LMO powders of the invention and water are mixed and stirred with each other to obtain slurry, and the obtained slurry may be subjected to solid-liquid separation by filtration to eliminate impurities. At this time, the solid-liquid separation may be carried out at a subsequent step.

The slurry means a state in which the LMO of the invention is dispersed in a polar solvent.

For the polar solvent that is used for washing, water is preferably used.

The Water may be tap water, but it is preferable to use tap water, ion-exchanged water, or deionized water that has been passed through a filter or a wet magnetic separator.

The pH of water is preferably 5 to 9.

With respect to a liquid temperature at the time of washing, it has been confirmed that when the liquid temperature is low, the battery characteristics become more satisfactory. Therefore, from such a viewpoint, the liquid temperature is preferably 5° C. to 70° C., more preferably 60° C. or lower, and particularly further more preferably 45° C. or lower. Furthermore, the liquid temperature is further more preferably 30° C. or lower.

The reason why the battery characteristics become more satisfactory when the liquid temperature at the time of washing is low is considered that when the liquid temperature is too high, some of the lithium in the LMO of the invention is ion-exchanged with protons of the ion-exchanged water, whereby lithium is removed, which affects high-temperature characteristics.

In regard to the amount of the polar solvent that is brought into contact with the LMO powders of the invention, the mass ratio of the LMO powders of the invention with respect to the polar solvent (also referred to as a "slurry concentration") is adjusted to be preferably 10 wt % to 70 wt %, more preferably from 20 wt % to 60 wt %, and further more preferably from 30 wt % to 50 wt %. When the amount of the polar solvent is 10 wt % or more, impurities such as $SO_4$ are easily eluted, and on the contrary, when the amount thereof is 60 wt % or less, a washing effect adequate for the amount of the polar solvent can be obtained.

<Characteristics and Applications>

After being crushed and classified as necessary, the LMO of the invention can be effectively used as a positive electrode active material for lithium batteries.

For example, a positive electrode mixture can be produced by mixing the LMO of the invention, a conductive material formed of carbon black or the like, and a binding agent formed of a TEFLON (registered trademark) binder or the like. Then, such a positive electrode mixture is used for a positive electrode, lithium or a material capable of storing and releasing lithium, such as carbon is used for a negative electrode, and a solution obtained by dissolving a lithium salt such as lithium hexafluorophosphate ($LiPF_6$) in a mixed solvent such as ethylene carbonate-dimethyl carbonate is used for a non-aqueous electrolyte, whereby a lithium secondary battery can be constructed. However, the invention is not meant to be limited to a battery having such a configuration.

A lithium battery having the LMO of the invention as the positive electrode active material can maintain capacity even when being stored at a high temperature, and thus it is particularly excellent for applications in the positive electrode active material for a large lithium battery which is used as a power source to drive motors mounted on an electric vehicle (EV) or a hybrid electric vehicle (HEV) in particular.

<Explanation of Expressions>

The term "lithium battery" means to include all of the batteries containing lithium or lithium ions therein, such as a lithium primary battery, a lithium secondary battery, a lithium ion secondary battery, and a lithium polymer battery.

In this specification, when the expression "X to Y" (X and Y are arbitrary numbers) is used, unless otherwise explicitly mentioned, the meaning of "X or more but Y or less" is included and at the same time, the meaning of "preferably greater than X" or "preferably Y or less" is included.

In addition, the expression "X or more" (X is an arbitrary number) or "Y or less" (Y is an arbitrary number) includes the intention of "it is preferable to be greater than X" or "it is preferable to be less than Y".

EXAMPLES

Hereinafter, the invention will be described in detail based on Examples and Comparative Examples. However, the invention is not limited to Examples that are given below.

Example 1

With the amount of Na being 0.2 wt % (molar ratio Na/Mn: $0.8 \times 10^{-2}$), an electrolytic manganese dioxide was obtained such that a weight loss in the range of from 150° C. to 500° C. was 4.3% as measured using differential thermal analysis, and 5500 g of the electrolytic manganese dioxide, 1366.75 g of lithium carbonate, 9.831 g of magnesium oxide, 200.269 g of aluminum hydroxide, and 48.056 g of boric acid were weighed and mixed with each other in a precision mixing machine, whereby a material mixture composition was obtained.

The obtained material mixture composition was filled in a calcination vessel (crucible made of alumina, size=length*width*height=10*10*5 (cm)) such that the ratio of an open area to a filling height (open area ($cm^2$)/filling height (cm)) would be 100. Apparent density of the material at this time was 1.1 g/$cm^3$. The material was calcined at 725° C. (product temperature) for 13 hours under an air atmosphere in an electric furnace, subsequently annealed (temperature lowering rate: 0.09° C./min) such that the temperature was lowered to 700° C. (product temperature) for 4.5 hours under the air atmosphere in the same electric furnace, and then cooled naturally to a normal temperature in the same electric furnace.

Subsequently, the material was crushed by a shear type crusher, and then was subjected to classification using a classifier, whereby a spinel-type lithium metal composite oxide powder (sample) having a size of under 325-meshe was obtained.

7000 g of the spinel-type lithium metal composite oxide (powder) thus obtained and 13.5 L of ion-exchanged water (pH 5.8, temperature being 20° C.) were mixed and stirred for 10 minutes to be washed, thereby obtaining slurry of the spinel-type lithium metal composite oxide (slurry concentration being 34 wt %). The liquid temperature at this time was 25° C. Then, the spinel-type lithium metal composite oxide (powder) obtained by filtration and separation of the slurry was heated while being maintained at 350° C. (product temperature) for 5 hours under an air atmosphere, was dried, and then was classified by the classifier, whereby a powdered spinel-type lithium metal composite oxide (sample) having a size of under 325-mesh was obtained.

Oxygen occupancy (OCC), strain, the content of Na, the content of Mn, and a crystallite size of the obtained spinel-type lithium metal composite oxide (sample) were measured, and the results were indicated in Table 1 (the same applies to Examples and Comparative Examples that will be described below). At this time, the ratio (B/Mn) of a molar content of B to a molar content of Mn was 0.013.

In addition, the fact that the sample was a spinel-type (Fd-3m) lithium metal composite oxide was confirmed by measurement according to the Rietveld method using a fundamental method (the same applied to Examples and Comparative Examples that will be described below).

Examples 2 to 5

A spinel-type lithium metal composite oxide (sample) was obtained in the same manner as in Example 1 except that a calcination temperature was changed to a temperature indicated in Table 1.

Example 6

A spinel-type lithium metal composite oxide (sample) was obtained in the same manner as in Example 1 except that a calcination temperature was changed to a temperature indicated in Table 1, 4733 g of chemically synthesized trimanganese tertaoxide (molar ratio Na/Mn: $2.0 \times 10^{-4}$) was used as a material instead of 5500 g of an electrolytic manganese dioxide, and the amount of boric acid was changed to 31.950 g.

Example 7

A spinel-type lithium metal composite oxide (sample) was obtained in the same manner as in Example 1 except that a calcination temperature was changed to a temperature indicated in Table 1 and annealing conditions were changed. The annealing was performed after the calcination in the same electric furnace as in the calcination in such a manner that, under an oxygen pressurized atmosphere (oxygen partial pressure being 0.19 MPa), the sample was heated to reach 730° C. (product temperature) at a temperature rising rate of 1.3° C./min and was then cooled to a room temperature at a temperature lowering rate of 1.3° C./min in the same electric furnace after being kept at the reached temperature for 15 hours.

Example 8

A spinel-type lithium metal composite oxide (sample) was obtained in the same manner as in Example 1 except that a calcination temperature was changed to a temperature indicated in Table 1 and 22.000 g of cobalt oxyhydroxide was used as a material instead of 9.831 g of magnesium oxide.

Example 9

A spinel-type lithium metal composite oxide (sample) was obtained in the same manner as in Example 1 except that a calcination temperature was changed to a temperature indicated in Table 1 and 243.9 g of nickel hydroxide was used as a material instead of 200.269 g of aluminum hydroxide.

Example 10

A spinel-type lithium metal composite oxide (sample) was obtained in the same manner as in Example 1 except that a calcination temperature was changed to a temperature indicated in Table 1 and 251.9 g of cobalt oxyhydroxide was used as a material instead of 200.269 g of aluminum hydroxide.

Comparative Examples 1 and 2

A spinel-type lithium metal composite oxide (sample) was obtained in the same manner as in Example 1 except that a boron material was changed from boric acid to lithium tetraborate and a calcinations temperature was changed to 850° C.

[Evaluation]

For the spinel-type lithium metal composite oxides (powders) obtained in Examples and Comparative Example, various characteristics were evaluated by the methods described below.

<Chemical Analysis Measurement>

The amount (ppm) of Na and the amount (mass %) of Mn of the spinel-type lithium metal composite oxides (powders) obtained in Examples and Comparative Example were measured by inductively coupled plasma (ICP) emission spectroscopy, and were indicated in Table 1.

In addition, the amount of each element of the spinel-type lithium metal composite oxides (powder, samples) obtained in Examples and Comparative Example was measured by inductively coupled plasma (ICP) emission spectroscopy, and a composition formula based on an analysis value was indicated in Table 1. However, the numbers described in the composition formula include an error due to rounding.

<Measurement of Crystallite Size and Oxygen Occupancy Using Rietveld Method>

For the samples (powders) obtained in Examples and Comparative Examples, the crystallite size and the oxygen occupancy were measured by the Rietveld method using the fundamental method to be described below.

The Rietveld method using the fundamental method is a method of refining structural parameters of a crystal from diffraction intensity obtained by powder X-ray diffraction or the like. In the method, a crystal structure model is assumed, and various parameters of this crystal structure are refined in such a way that the X-ray diffraction pattern derived from the structure by calculation matches as much as possible an X-ray diffraction pattern that is actually measured.

An X-ray diffraction device (D8 ADVANCE, manufactured by Bruker AXS) using a Cu-Kα ray was used for the measurement of the X-ray diffraction patterns. Peaks of the X-ray diffraction patterns obtained from a diffraction angle (2θ) being in the range of 10 to 120° were analyzed using analysis software (product name: "Topas Version 3") to determine the crystallite size and the oxygen occupancy.

It was assumed that the crystal structure was belonged to a cubic crystal of a space group Fd-3m (Origin Choice 2) and that Li was present at a 8a site thereof, it was assumed that Mn, a substitute element of Mn, that is, any appropriate element of Mg, Al, Co, or Ni according to Examples, an extra Li fraction, and Na were present at a 16d site thereof, and it was assumed that O is present at a 32e site thereof.

In addition, as for the LMO structure, when specificity of atomic displacement described above is considered, it is necessary to consider a thermal vibration of each atom. Each atom was defined to thermally vibrate in isotropic-spherical symmetry, an isotropic atomic displacement parameter of each element was determined with reference to mean square displacement results (M. Yonemura et al., Journal of Materials Chemistry, 14, 1948 (2004)) of each atom determined by experimental results obtained by neutron diffraction. For the isotropic atomic displacement parameter B of each element, an Li atom was fixed to 1.0638, an Mn atom was fixed to 0.8361, and an O atom was fixed to 1.1122, and with fractional coordinates of oxygen serving as variables and watching for the indices representing the extent of the match between the observed intensities and the calculated intensities Rwp<10.0 and GOF<2.0, the calculation was performed repeatedly until the indices converged. The crystallite size and the strain were analyzed using the Gauss function.

Instrument specifications, conditions, and the like that are used for another measurement and Rietveld method analysis are as follows:

Detector: PSD
Detector Type: VANTEC-1
High Voltage: 5585 V
Discr. Lower Level: 0.25 V
Discr. Window Width: 0.15 V
Grid Lower Level: 0.075 V
Grid Window Width: 0.524 V
Flood Field Correction: Disabled
Primary radius: 250 mm
Secondary radius: 250 mm
Receiving slit width: 0.1436626 mm
Divergence angle: 0.3°
Filament Length: 12 mm
Sample Length: 25 mm
Receiving Slit Length: 12 mm
Primary Sollers: 2.623°
Secondary Sollers: 2.623°
Lorentzian, 1/Cos: 0.004933548 Th <Measurement of Lattice Strain>

Apart from strain obtained by the Rietveld method analysis described above, strain of a crystal lattice was determined by analysis according to the following method.

The lattice strain with respect to the spinel-type lithium metal composite oxide can be qualitatively determined by a peak width of XRD. In order to quantitatively evaluate the lattice strain, the Williamson-Hall method represented by the following Formula (1) known in the field of X-ray crystallography is advantageously used (Hall, W. II., J. Inst. Met., 75, 1127(1950); idem, Proc. Phys. Soc., A 62, 741 (1949)).

$$\beta \cos \theta / \lambda = 2\eta(\sin \theta / \lambda) + (1/\epsilon) \quad (1)$$

In Formula (1), the symbol $\eta$ represents the lattice strain (dimensionless number), the symbol $\beta$ represents a width (radian) of a diffraction line according to a crystallite size, the symbol $\lambda$ represents a wavelength (Å) of a measuring X-ray, the symbol $\theta$ represent a Bragg angle (radian) of the diffraction line, and the symbol $\epsilon$ represents a constant. The symbol $\eta$ being the lattice strain represents a dimensionless number, but means a value that is multiplied by 100 and is expressed by %.

For the samples (powders) obtained in Examples and Comparative Examples, the lattice strain was measured by the following method.

Diffraction peaks of the object were measured by powder XRD using a CuKα ray as an X-ray source. Then, an integral breadth of all the diffraction peaks appearing at or below the diffraction angle of $2\theta=90°$ was actually measured. The Williamson-Hall method described above was applied to the actually measured value to calculate the lattice strain. $LaB_6$, which was a standard sample for X-ray diffraction, was used to estimate an instrumental function in calculating the integral breadth.

The diffraction peaks appearing typically at or below the diffraction angle of 90° occur in, for example, (111) plane, (220) plane, (311) plane, (222) plane, (400) plane, (331) plane, (511) plane, (333) plane, (440) plane, (531) plane, (533) plane, (622) plane, (444) plane, (551) plane, and (711) plane.

<Battery Evaluation>

(Production of Battery)

8.80 g of a spinel-type lithium metal composite oxide (powder), 0.60 g of acetylene black (manufactured by Denki Kagaku Kogyo K.K.), and 5.0 g of a liquid obtained by dissolving PVDF (manufactured by Kishida Chemical Co., Ltd.) in NMP (N-methylpyrrolidone) at a concentration of 12 wt % were accurately measured, 5 ml of NMP was added thereto, and the mixture was sufficiently mixed to produce a paste. This paste was applied on an aluminum foil as a current collector, and was coated thereon using an applicator that had been adjusted to a gap of 250 μm. The paste was dried in a vacuum for one whole day and night at 120° C., and then the aluminum foil was punched to a specimen having a size of φ16 mm and subjected to press compaction at 4 t/cm². This was used as a positive electrode. Immediately before the production of a battery, the positive electrode was dried in a vacuum at 120° C. for 120 min or more, attached moisture was removed, and the positive electrode was incorporated into a battery. Furthermore, the average value of the weight of an aluminum foil specimen having a size of φ16 mm was determined in advance, and the weight of the aluminum foil was subtracted from the weight of the positive electrode to determine the weight of the positive electrode mixture. Furthermore, the content of the positive electrode active material was determined from the mixing ratio of the positive electrode active material, acetylene black, and PVDF.

A negative electrode was produced from lithium metal with a size of φ20 mm×thickness of 1.0 mm, and a cell for electrochemical evaluation, TOMCEL (registered trademark) illustrated in FIG. 1 was produced using these materials.

In the electrochemical cell depicted in the drawing, a positive electrode 3 formed from the positive electrode mixture described above was disposed at the center inside a lower body 1 made of stainless steel having resistance to organic electrolyte. At the upper surface of this positive electrode 3, a separator 4 made of a finely porous polypropylene resin, which was impregnated with an electrolyte liquid, was disposed, and the separator was fixed by a spacer 5 made from a PTFE material such as TEFLON® (registered trademark of DuPont). Furthermore, a negative electrode 6 formed of lithium metal was disposed below the upper surface of the separator, a spacer 7 which also functioned as a negative electrode terminal was disposed, and the assembly was covered thereon with an upper body 2 and then tightened with screws. Thus, the battery was sealed.

For the electrolyte liquid, a mixture of EC and DMC at a volume ratio of 3:7 was used as a solvent, and a solution prepared by dissolving LiPFo as a solute in this solvent at 1 mol/L was used.

(Evaluation of High-Temperature Storage Characteristics)

When an electrochemical cell was stored at 60° in the following state, a capacity retention rate thereof was measured.

Constant-current charge and discharge measurement was performed on the electrochemical cell at a current value of 0.2 C in a voltage range of from 3 to 4.5 V (using Li as a base), and thus it was confirmed that the electrochemical cell had sufficient electrochemical activity. Thereafter, electrochemical cell was charged up to 40% SOC (State Of Charge) and was stored for five days in a constant-temperature bath of 60° C.

After the storage of the electrochemical cell, capacity (residual capacity) remaining in the cell after the discharge of the electrochemical cell was measured, the residual capacity was divided by capacity charged before the storage to obtain a capacity retention rate, and the results were indicated in Table 2.

The SOC refers to a state where the electrochemical cell is charged, and a fully charged state is defined as 100% SOC.

In addition, with respect to Examples 2 and 5 and Comparative Examples 1 and 2, the period of the high-temperature storage was extended up to 28 days, a battery in a state of being discharged up to 3 V was disassembled in a glove box under an argon atmosphere, and thus a positive electrode was taken out. The obtained positive electrode was sealed with a transparent laminate to perform XRD measurement. Then, diffraction peaks due to a conduction supporting agent or the like were excluded and a change in lattice constant derived from the LMO structure was confirmed.

The change in lattice constant belonged to the LMO before and after the period of the high-temperature storage for 28 days was, under the condition of 40% SOC, 0.001 Å in Example 2, 0.002 Å in Example 5, 0.016 Å in Comparative Example 1, and 0.015 Å in Comparative Example 2, and from these results, the change in lattice constant was small in Examples.

Even under the condition of 100% SOC, the change in lattice constant was 0.002 Å in Example 2, 0.002 Å in Example 5, 0.005 Å in Comparative Example 1, and 0.006 Å in Comparative Example 2, and from these results, the change in lattice constant was similarly small in Examples.

It is considered that the results obtained in Examples as described above are results of mitigation of the change in lattice constant before and after the high-temperature storage when the lattice strain is appropriately applied.

From the above results of Examples and the test results carried out so far by the inventors, it was found that in the spinel-type (Fd-3m) lithium metal composite oxide, the oxygen occupancy (OCC) was controlled to be 0.965 to 1.000 as determined by the Rietveld method, the lattice strain was controlled to be 0.015 to 0.090 and preferably 0.020 to 0.090 as determined by the Williamson-Hall method, and the ratio (Na/Mn) of the molar content of Na to the molar content of Mn was controlled to satisfy $0.00<Na/Mn<1.00\times10^{-2}$, whereby excellent high-temperature storage characteristics could be exhibited when the spinel-type lithium metal composite oxide was used as the positive electrode active material for the lithium battery.

This can be inferred from the fact that since the strain becomes large when Na is taken in the 16d site of the spinel-type (Fd-3m) crystal structure and thus variation in strain (variation in stress) depending on expansion and contraction of the crystal lattice is mitigated, the high-temperature storage characteristics is increased.

TABLE 1

| | Calcination temperature (° C.) | OCC (Oxygen occupancy) | Strain (Williamson-Hall method) | Content of Na (ppm) | Content of Mn (mass %) | Na/Mn (molar ratio) × $10^{-4}$ | Crystallite size (nm) | Composition |
|---|---|---|---|---|---|---|---|---|
| Example 1 | 725 | 0.987 | 0.033 | 80 | 57.6 | 3.32 | 178 | $Li_{1.070}Mn_{1.846}Al_{0.078}Mg_{0.007}O_4$ |
| Example 2 | 750 | 0.972 | 0.037 | 80 | 57.7 | 3.31 | 189 | $Li_{1.069}Mn_{1.847}Al_{0.078}Mg_{0.007}O_4$ |
| Example 3 | 760 | 0.970 | 0.021 | 40 | 57.8 | 1.65 | 188 | $Li_{1.073}Mn_{1.843}Al_{0.077}Mg_{0.006}O_4$ |
| Example 4 | 770 | 0.973 | 0.023 | 110 | 57.7 | 4.56 | 183 | $Li_{1.069}Mn_{1.847}Al_{0.078}Mg_{0.007}O_4$ |
| Example 5 | 770 | 0.975 | 0.031 | 20 | 57.6 | 0.83 | 189 | $Li_{1.068}Mn_{1.847}Al_{0.078}Mg_{0.007}O_4$ |
| Example 6 | 770 | 0.973 | 0.044 | 20 | 57.4 | 0.83 | 179 | $Li_{1.081}Mn_{1.832}Al_{0.080}Mg_{0.007}O_4$ |
| Example 7 | 770 | 0.973 | 0.017 | 20 | 57.6 | 0.83 | 218 | $Li_{1.077}Mn_{1.839}Al_{0.077}Mg_{0.007}O_4$ |
| Example 8 | 770 | 0.970 | 0.052 | 50 | 57.5 | 2.08 | 195 | $Li_{1.078}Mn_{1.837}Al_{0.077}Co_{0.007}O_4$ |
| Example 9 | 760 | 0.975 | 0.072 | 80 | 57.0 | 3.35 | 146 | $Li_{1.073}Mn_{1.849}Ni_{0.072}Mg_{0.005}O_4$ |
| Example 10 | 800 | 0.967 | 0.046 | 60 | 56.8 | 2.52 | 193 | $Li_{1.064}Mn_{1.851}Co_{0.078}Mg_{0.007}O_4$ |
| Comparative Example 1 | 850 | 0.959 | 0.013 | 10 | 57.7 | 0.41 | 205 | $Li_{1.074}Mn_{1.840}Al_{0.078}Mg_{0.007}O_4$ |
| Comparative Example 2 | 850 | 0.960 | 0.018 | 20 | 57.8 | 0.83 | 210 | $Li_{1.084}Mn_{1.834}Al_{0.075}Mg_{0.007}O_4$ |

TABLE 2

| | 40% SOC Five days |
|---|---|
| Example 1 | 89.9 |
| Example 2 | 92.2 |
| Example 3 | 90.3 |
| Example 4 | 90.0 |
| Example 5 | 86.9 |
| Example 6 | 86.2 |
| Example 7 | 94.4 |
| Example 8 | 91.5 |
| Example 9 | 86.8 |
| Example 10 | 89.5 |
| Comparative Example 1 | 77.6 |
| Comparative Example 2 | 78.9 |

The invention claimed is:

1. A spinel-type (Fd-3m) lithium metal composite oxide in which oxygen occupancy (OCC) is 0.965 to 1.000 as determined by the Rietveld method, lattice strain is 0.015 to 0.090 as determined by the Williamson-Hall method, and a ratio (Na/Mn) of a molar content of Na to a molar content of Mn satisfies $0.00<Na/Mn<1.00\ 10^{-2}$.

2. The spinel-type (Fd-3m) lithium metal composite oxide according to claim 1, wherein a crystallite size is 100 nm to 250 nm.

3. The spinel-type (Fd-3m) lithium metal composite oxide according to claim 2, wherein the spinel-type (Fd-3m) lithium metal composite oxide is represented by a general formula: $Li_{1+x}M_{2-x}O_4$ wherein, M in the formula represents Mn and optionally one or more metal elements selected from the group consisting of Al, Mg, Ca, Ti, Ba, Cr, Fe, Co, Ni, Cu, and Zn, and x is 0.01 to 0.09.

4. A lithium secondary battery having the spinel-type lithium metal composite oxide according to claim 3 as a positive electrode active material.

5. A lithium secondary battery having the spinel-type lithium metal composite oxide according to claim 2 as a positive electrode active material.

6. The spinel-type (Fd-3m) lithium metal composite oxide according to claim 1, wherein the spinel-type (Fd-3m) lithium metal composite oxide is represented by a general formula: $Li_{1+x}M_{2-x}O_4$ wherein, M in the formula represents Mn and optionally one or more metal elements selected from the group consisting of Al, Mg, Ca, Ti, Ba, Cr, Fe, Co, Ni, Cu, and Zn, and x is 0.01 to 0.09.

7. A lithium secondary battery having the spinel-type lithium metal composite oxide according to claim 6 as a positive electrode active material.

8. A lithium secondary battery having the spinel-type lithium metal composite oxide according to claim 1 as a positive electrode active material.

9. A spinel-type (Fd-3m) lithium metal composite oxide in which oxygen occupancy (OCC) is 0.965 to 1.000 as determined by the Rietveld method, lattice strain is 0.020 to 0.090 as determined by the Williamson-Hall method, and a ratio (Na/Mn) of a molar content of Na to a molar content of Mn satisfies $0.00<Na/Mn<1.00\ 10^{-2}$.

10. The spinel-type (Fd-3m) lithium metal composite oxide according to claim 9, wherein a crystallite size is 100 nm to 250 nm.

11. The spinel-type (Fd-3m) lithium metal composite oxide according to claim 10, wherein the spinel-type (Fd-3m) lithium metal composite oxide is represented by a general formula: $Li_{1+x}M_{2-x}O_4$ wherein, M in the formula represents Mn and optionally one or more metal elements selected from the group consisting of Al, Mg, Ca, Ti, Ba, Cr, Fe, Co, Ni, Cu, and Zn, and x is 0.01 to 0.09.

12. A lithium secondary battery having the spinel-type lithium metal composite oxide according to claim 11 as a positive electrode active material.

13. The spinel-type (Fd-3m) lithium metal composite oxide according to claim 9, wherein the spinel-type (Fd-3m) lithium metal composite oxide is represented by a general formula: $Li_{1+x}M_{2-x}O_4$ wherein, M in the formula represents Mn and optionally one or more metal elements selected from the group consisting of Al, Mg, Ca, Ti, Ba, Cr, Fe, Co, Ni, Cu, and Zn, and x is 0.01 to 0.09.

14. A lithium secondary battery having the spinel-type lithium metal composite oxide according to claim 13 as a positive electrode active material.

15. A lithium secondary battery having the spinel-type lithium metal composite oxide according to claim 9 as a positive electrode active material.

* * * * *